(12) United States Patent
Al-Sa'di et al.

(10) Patent No.: US 10,566,423 B2
(45) Date of Patent: Feb. 18, 2020

(54) SEMICONDUCTOR SWITCH DEVICE AND A METHOD OF MAKING A SEMICONDUCTOR SWITCH DEVICE

(71) Applicant: NXP B.V., Eindhoven (NL)

(72) Inventors: Mahmoud Shehab Mohammad Al-Sa'di, Kleve (DE); Johannes Josephus Theodorus Marinus Donkers, Valkenswaard (NL); Petrus Hubertus Cornelis Magnee, Malden (NL); Ihor Brunets, Kleve (DE); Anurag Vohra, Nijmegen (NL); Jan Willem Slotboom, Eersel (NL)

(73) Assignee: NXP B.V.., Eindhoven (NL)

( * ) Notice: Subject to any disclaimer, the term of this patent is extended or adjusted under 35 U.S.C. 154(b) by 96 days.

(21) Appl. No.: 15/396,558

(22) Filed: Dec. 31, 2016

(65) Prior Publication Data

US 2017/0221994 A1 Aug. 3, 2017

(30) Foreign Application Priority Data

Jan. 28, 2016 (EP) .................................. 16153174

(51) Int. Cl.
*H01L 29/10* (2006.01)
*H01L 27/02* (2006.01)
(Continued)

(52) U.S. Cl.
CPC .. *H01L 29/1095* (2013.01); *H01L 21/823437* (2013.01); *H01L 27/0222* (2013.01);
(Continued)

(58) Field of Classification Search
CPC ......... H01L 29/1095; H01L 21/823437; H01L 29/0619; H01L 27/0222; H01L 29/78; H01L 27/088; H01L 29/1087; H01L 29/0847; H01L 29/0649; H01L 29/66568; H01L 29/1083
See application file for complete search history.

(56) References Cited

U.S. PATENT DOCUMENTS

| 4,433,257 A | 2/1984 | Kinoshita |
| 4,504,930 A | 3/1985 | Harwig et al. |
| (Continued) | | |

OTHER PUBLICATIONS

Extended European Search Report for Patent Appln. No. 16153174.4 (dated Jun. 24, 2016).

*Primary Examiner* — Mohammed R Alam

(57) ABSTRACT

A semiconductor switch device for switching an RF signal and a method of making the same. The device includes a first semiconductor region having a first conductivity type. The device also includes a source region and a drain region located in the first semiconductor region. The source region and the drain region have a second conductivity type. The second conductivity type is different to the first conductivity type. The device further includes a gate separating the source region from the drain region. The device also includes at least one sinker region having the second conductivity type. Each sinker region is connectable to an external potential for drawing minority carriers away from the source and drain regions to reduce a leakage current at junctions between the source and drain regions and the first semiconductor region.

13 Claims, 2 Drawing Sheets

(51) Int. Cl.
  *H01L 29/06* (2006.01)
  *H01L 21/8234* (2006.01)
  *H01L 27/088* (2006.01)
  *H01L 29/08* (2006.01)
  *H01L 29/66* (2006.01)
  *H01L 29/78* (2006.01)
(52) U.S. Cl.
  CPC ........ *H01L 27/088* (2013.01); *H01L 29/0619* (2013.01); *H01L 29/0649* (2013.01); *H01L 29/0847* (2013.01); *H01L 29/1087* (2013.01); *H01L 29/66568* (2013.01); *H01L 29/78* (2013.01); *H01L 29/1083* (2013.01)

(56) References Cited

U.S. PATENT DOCUMENTS

| | | | |
|---|---|---|---|
| 4,701,637 A | 10/1987 | Piro | |
| 5,945,713 A | 8/1999 | Voldman | |
| 6,033,946 A * | 3/2000 | Hutter | H01L 21/8249 257/370 |
| 6,194,776 B1 * | 2/2001 | Amano | H01L 21/761 257/372 |
| 2003/0127689 A1 * | 7/2003 | Hebert | H01L 21/26513 257/336 |
| 2008/0002476 A1 * | 1/2008 | Yoo | H01L 27/115 365/185.18 |
| 2015/0228649 A1 * | 8/2015 | Singh | H01L 27/0886 257/401 |

\* cited by examiner

SEMICONDUCTOR SWITCH DEVICE AND A METHOD OF MAKING A SEMICONDUCTOR SWITCH DEVICE

CROSS-REFERENCE TO RELATED APPLICATIONS

This application claims the priority under 35 U.S.C. § 119 of European patent application no. 16153174.4, filed Jan. 28, 2016 the contents of which are incorporated by reference herein.

BACKGROUND

The present specification relates to a semiconductor switch device for switching an RF signal and to a method of making a semiconductor switch device for switching an RF signal.

Semiconductor devices such as power MOSFETs can be used as electric switches for high frequency pulse width modulation applications and as load switches in power applications. When used as load switches, where switching times are usually long, cost, size and on-resistance ($R_{on}$) of the switches are the prevailing design considerations. When used in high frequency pulse width modulation applications, the MOSFET may be required to exhibit small power losses during switching, which may impose an additional requirement for small internal capacitances. One of the most popular ways to evaluate the performance of a power MOSFET is to calculate the figure of merit (FOM), which may be defined as the product of the on-state resistance ($R_{on}$) and the off-state capacitance ($C_{off}$) of the device. Leakage currents within the device may also be important to the overall performance of the device.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor switch device for switching an RF signal comprising:

a first semiconductor region having a first conductivity type;

a source region and a drain region located in the first semiconductor region, wherein the source region and the drain region have a second conductivity type, wherein the second conductivity type is different to the first conductivity type;

a gate separating the source region from the drain region; and at least one sinker region having the second conductivity type, wherein each sinker region is connectable to an external potential for drawing minority carriers away from the source and drain regions to reduce a leakage current at junctions between the source and drain regions and the first semiconductor region.

According to another aspect of the present disclosure, there is provided a method of making a semiconductor switch device for switching an RF signal, the method comprising:

providing a first semiconductor region having a first conductivity type;

forming a gate;

forming a source region and a drain region located in the first semiconductor region, wherein the source region and the drain region have a second conductivity type, wherein the second conductivity type is different to the first conductivity type, wherein the gate separates the source region from the drain region; and forming at least one sinker region having the second conductivity type, wherein each sinker region is connectable to an external potential for drawing minority carriers away from the source and drain regions to reduce a leakage current at junctions between the source and drain regions and the first semiconductor region.

In a semiconductor switch device for switching an RF signal, the device including a source region and a drain region located in a semiconductor region of a different conductivity type, leakage currents may take place in the diode formed by the source/drain region and the first semiconductor region. For instance, this leakage current may be due to a depletion current at low temperatures and a diffusion current at higher temperatures. The provision of the at least one sinker region may allow this leakage current to be reduced by drawing minority carriers (associated with the above mentioned diffusion current) away from the source and drain regions. This may be achieved in some embodiments without necessarily degrading the device figure-of-merit ($R_{on} \times C_{off}$) and/or without increasing the device complexity.

In some examples, at least one of the at least one sinker regions may be located in the first semiconductor region with the source and drain regions. The proximity of the sinker region(s) to the source and drain regions may enhance the ability of the sinker region(s) to prevent minority carriers reaching the junctions between the source and drain regions and the first semiconductor region.

At least one sinker region in the first semiconductor region may be separated from the source region or the drain region by a spacer such as a dummy gate or an isolation region (e.g. a trench containing dielectric) located in the first semiconductor region.

In some examples, the source region and/or the drain region may be provided with their own sinker regions. Accordingly, one of the sinker regions may be a source sinker region located proximate to the source region in the first semiconductor region and one of the sinker regions may be a drain sinker region located proximate to the drain region in the first semiconductor region. The allocation of a respective sinker region for the source and/or the drain region may enhance the ability of the sinker region(s) to draw minority carriers away from the source and drain regions.

At least one of the at least one sinker regions may be located outside the first semiconductor region. These sinker regions may be electrically connected to the an underlying substrate region of the device. By providing the sinker regions outside the first semiconductor region, an increase in the complexity of the device in the vicinity of the source and drain regions may be avoided, which may make the device easier to manufacture. The sinker region(s) located outside the first semiconductor region may be located in a semiconductor region that is separated from the first semiconductor region by an isolation region (such as a trench filled with dielectric).

In some examples the device may include at least one further semiconductor region having the first conductivity type. These further semiconductor region(s) may be connected to an external potential for applying a potential to the first semiconductor region. This may allow the body region of a transistor formed by the source region, drain region and gate to be biased.

At least one of the at least one further semiconductor regions may be located in the first semiconductor region with the source and drain regions. At least one of the at least one further semiconductor regions may be located outside the first semiconductor region and may be electrically connected to the first semiconductor region via an underlying substrate region of the device.

In some examples, the device may include a semiconductor layer having said first conductivity type located immediately beneath the first semiconductor region. A doping level of the further region may be higher than a doping level of the first semiconductor region. The semiconductor layer having said first conductivity type may further reduce leakage currents within the device. It is envisaged that in some examples, the device may not include a semiconductor layer of the kind described above—in such examples, the first semiconductor region may be located directly on an underlying substrate region of the device. The provision of the first semiconductor region directly on the underlying substrate region in this manner may reduce parasitic junction capacitance within the device (since the absence of the highly doped semiconductor layer may allow the amount of doping in the vicinity of the first semiconductor region to be reduced), for reducing the off-state capacitance of the device. In such examples, the potentially higher leakage currents in the device may be mitigated by the provision of the at least one sinker region.

The first conductivity type may be p-type and the second conductivity type may be n-type. Accordingly, in some embodiments, the device may comprise an NMOS transistor. However, it is also envisaged that the first conductivity type may be n-type and the second conductivity type may be p-type. Accordingly, in some embodiments, the device may comprise a PMOS transistor.

The external potential may be ground. Where the first conductivity type is p-type, the external potential may be a positive potential. Conversely, where the first conductivity type is n-type, the external potential may be a negative potential. The external potential may be a power supply potential of the device.

For the purposes of this disclosure "Radio Frequency" (RF) refers to frequencies typically in the range of, but not limited to 0.5 GHz≤f≤30 GHz. Note that although a semiconductor switch device according to embodiments of this disclosure may be used to pass or block an RF signal, typically the device would not actually switch at the RF frequency itself.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
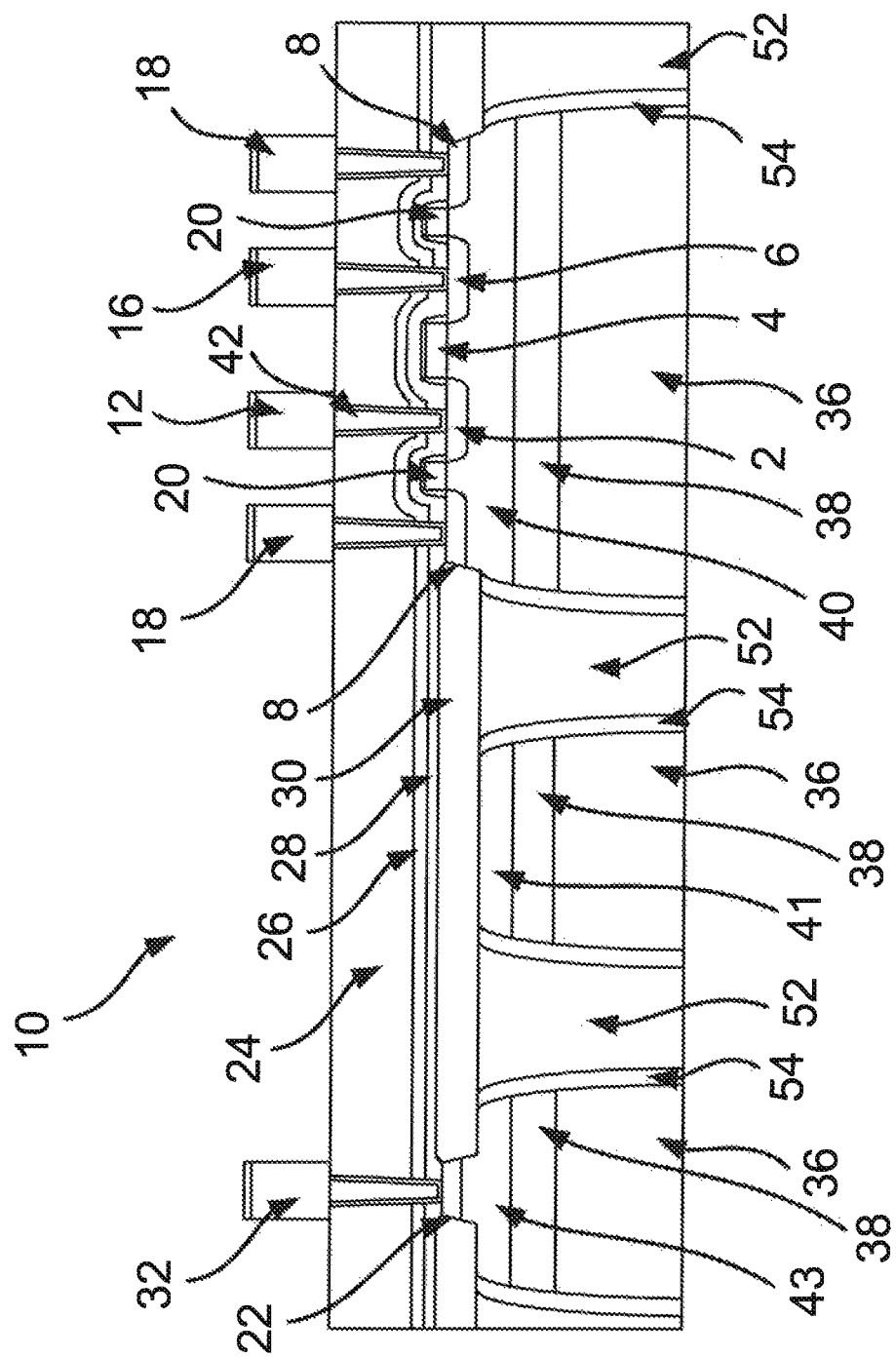
FIG. 1 shows a semiconductor device according to an embodiment of this disclosure.
Figure 2:
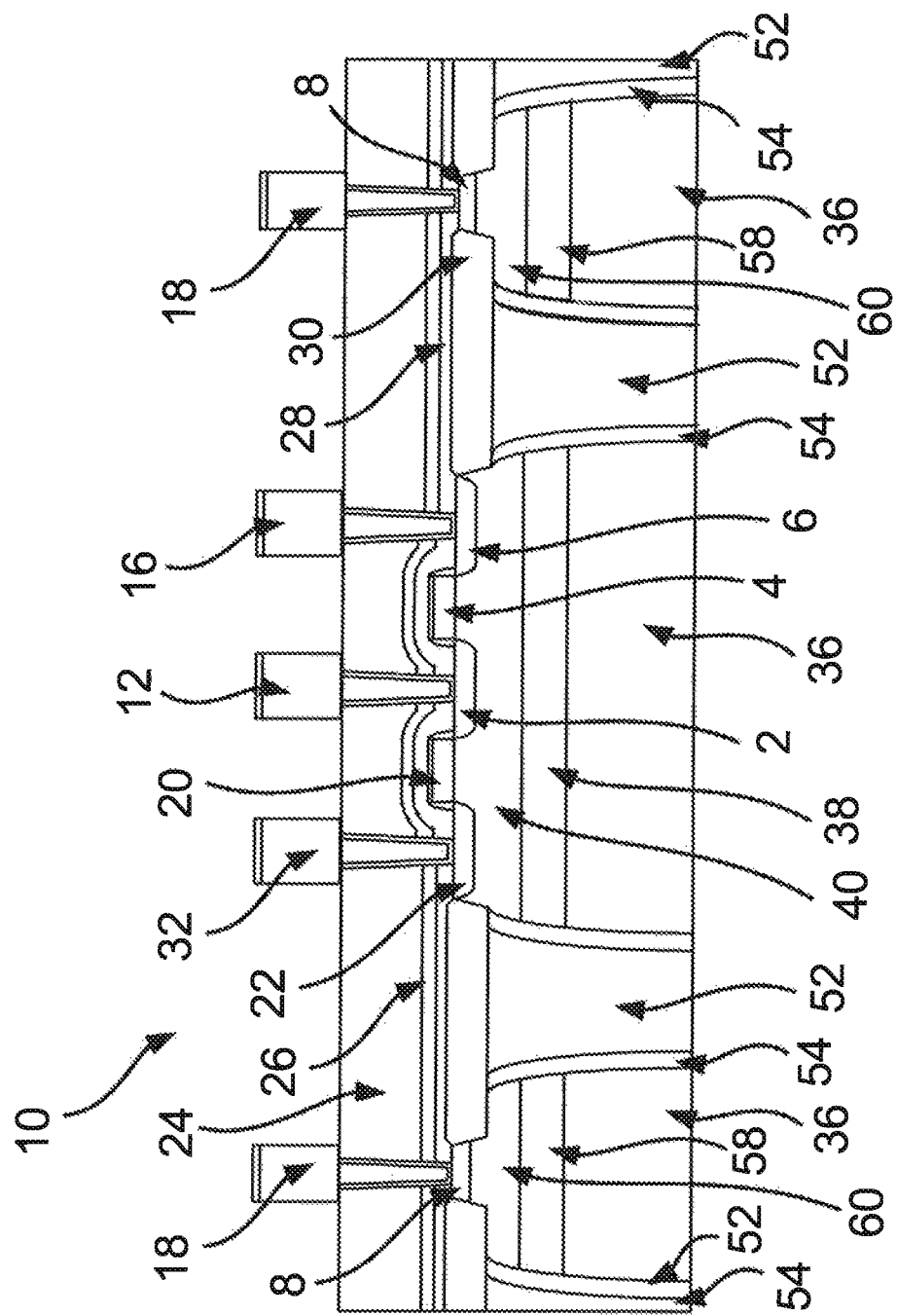
FIG. 2 shows a semiconductor device according to another embodiment of this disclosure.

FIGS. 1 and 2 each show a semiconductor device 10 according to an embodiment of this disclosure. The device 10 may be implemented on a semiconductor substrate comprising, for instance, silicon. It is envisaged that the substrate may be a so called Silicon on Insulator (SOI) substrate comprising a layer of silicon grown epitaxially on an insulating layer. In the examples shown in FIGS. 1 and 2, the device includes features forming an NMOS (N-channel Metal Oxide Semiconductor) transistor. However, it is envisaged that embodiments of this disclosure may also include features forming a PMOS (P-channel Metal Oxide Semiconductor) transistor. It will be appreciated that the embodiments shown in FIGS. 1 and 2 may be implemented as PMOS devices instead of NMOS devices simply be reversing the polarity of the dopants (e.g. so that n-type regions are instead p-type regions, and vice versa).

The device in FIG. 1 includes a first semiconductor region 40, which may comprise silicon be doped to have p-type conductivity. The first semiconductor region 40 in this example (and also the semiconductor region 43 and the semiconductor region 41 described below) is formed from a region of silicon located near the major surface of a semiconductor substrate. In this example, the first semiconductor region 40 is located on top of a buried semiconductor layer 38. The layer 38 is p-type doped, and has a doping level which is higher than that of the first semiconductor region 40. The layer 38 may be provided to reduce leakage currents within the NMOS device to be described below.

Note that the buried semiconductor layer 38 may extend across the substrate, whereby the semiconductor region 43 and the semiconductor region 41 may also be located on top of the buried semiconductor layer 38. In the present example, the buried semiconductor layer 38 is located on top of an underlying part 36 of the semiconductor substrate. Like the first semiconductor region 40, the semiconductor region 43 may also be doped to have p-type conductivity. Semiconductor region 41 may be left un-doped or low-doped.

In some embodiments, the dopant level within the layer 38 may be lowered, or the layer 38 may be omitted (in which case the first region 40, the region 41 and the region 43 may be located directed on the underlying part 36 of the semiconductor substrate). These steps may be taken in order to reduce the general amount of dopants used in the device, thereby to seek to reduce parasitic junction capacitance within the device 10. Although this may potentially also lead to an increase in leakage currents within the device 10, it is envisaged that the this may be mitigated by the provision of the sinker regions 8 to be described below.

The first semiconductor region 40, the semiconductor region 43, the semiconductor region 41 and the parts of the buried semiconductor layer 38 upon which they are located may be separated from each other by one or more isolation regions 52. The isolations region 52 may, for instance, comprise trenches filled with a dielectric or material with low conductivity such as un-doped polysilicon. The trenches may be lined with one or more dielectric layers 54, such as silicon oxide. The isolation regions 52 may extend down into the substrate from a major surface of the substrate, and may pass completely through the semiconductor region that forms the first semiconductor region 40, the semiconductor region 43 and the semiconductor region 41, as well as completely through the buried semiconductor layer 38. The isolation regions 52 may extend at least partially into the underlying part 36 of the semiconductor substrate. Although not shown in FIG. 1, the lower parts of the underlying part 36 of the semiconductor substrate are not isolated from each other by the isolation regions (which extend only partially into the underlying part 36 of the semiconductor substrate), and accordingly the first semiconductor region 40 may be electrically connected to the semiconductor region 43 and the semiconductor region 41 via the underlying part 36 (and also the optional buried layer 38).

In some examples, further isolation regions 30 (such as shallow trench isolation (STI)) may be located at the major surface of the semiconductor substrate. These isolation regions 30 may allow features of the device 10 located at or near the surface of the semiconductor substrate to be separated from each other. For instance, in this example, isolation regions 30 comprising STI are used to separate the features of the NMOS transistor formed in the first semiconductor region 40 from the further semiconductor region 22 to be described below.

One or more inter metal dielectric layers 24, 26, 28 may be provided on the major surface (for example silicon oxide and silicon nitride).

The device 10 in this example also includes a source region 2 and a drain region 6, which are both located in the first semiconductor region 40. The source region 2 and the drain region 6 in this example are doped to have n-type conductivity. The source region 2 and the drain region 6 are separated by a gate 4. The gate 4 may include a gate electrode located on a gate dielectric, which itself may be located on a part of the major surface of the semiconductor substrate located in between the source region 2 and the drain region 6. It will be appreciated that the transistor formed by the source region 2, drain region 6 and gate 4 in this example is an NMOS transistor, although as mentioned previously, it is envisaged that embodiments of this disclosure may alternatively be applied using a PMOS transistor.

Contacts 12, 16 may provide electrical connections to the source region 2 and the drain region 6, respectively. A similar contact may be used to provide an electrical connection for the gate 4 (not shown in FIG. 1). Each contact may include a part 42, which extends down through the inter metal dielectric layers 24, 26, 28 to connect with the source region 2, drain region 6 and gate 4.

In order to apply a potential to the first semiconductor region 40 (within which the channel region of the NMOS transistor will be formed during operation of the device 10), a further semiconductor region 22 is provided in this example. The further semiconductor region 22 may be located in the semiconductor region 43. The further semiconductor region 22 in this example is doped to have p-type conductivity, and may typically have a doping level that is higher than the doping level of the semiconductor region 43.

As shown in FIG. 1, the further semiconductor region 22 may be provided with a contact 32 similar to the contacts 12, 16 described above in respect of the source region 2 and the drain region 6. As described previously, semiconductor region 43 is electrically connected to the first semiconductor region 40 via the underlying part 36 of the semiconductor substrate, so that a potential applied to the contact 32 may be used to vary the potential within the first semiconductor region 40.

In accordance with embodiments of this disclosure, the device 10 is provided with at least one sinker region 8. Each sinker region 8 is doped to have n-type conductivity in this example. In devices forming PMOS transistors, the sinker regions may instead be doped to have p-type conductivity. The doping level of the sinker regions 8 (and also of the source region 2 and drain region 6) may be higher than that of the first semiconductor region 40 (noting also that the sinker regions 8, the source region 2 and the drain region 6 each have a conductivity type that is different to that of the first semiconductor region 40). It is envisaged that the sinker regions 8 may be formed in the first semiconductor region using the same process step (e.g. by ion implantation) that is used to form the source region 2 and the drain region 6.

Each sinker region may be connectable to an external potential. For instance, as shown in FIG. 1, each sinker region 8 may be provided with a contact 18, which may be similar to the contacts 12, 16 described above in relation to the source region 2 and the drain region 6.

In the present example, each sinker region 8 is located in the first semiconductor region 40. The present example includes two sinker regions 8. It is envisaged that a single sinker region 8 (or more than two sinker regions 8) may be provided. As shown in FIG. 1, a one of the sinker regions (referred to herein as the source sinker region) is located proximate the source region 8. As also shown in FIG. 1, another of the sinker regions 8 (referred to herein as the drain sinker region) is located proximate to the drain region 6. Each sinker region 8 located in the first semiconductor region 40 may be separated from the source region or the drain region for example by a spacer. In the present example, each spacer comprises a dummy gate 20, which may be located on the major surface of the semiconductor substrate, in between the source region 2 or drain region 6 and the sinker region 8. It is envisaged that other kinds of spacer may be used, such an isolation region (e.g. a trench containing dielectric) located in the first semiconductor region 40 in between the source region 2 or drain region 6 and the sinker region 8.

A potentially significant contribution to leakage currents in an NMOS or PMOS transistor arises from leakage current through the diode that is formed by the junction between the source and drain regions and the semiconductor region (having a different conductivity type) in which they are located. This leakage current may be due to a depletion current at low temperatures and a diffusion current at higher temperatures.

In accordance with embodiments of this disclosure, a potential applied to the sinker region(s) 8 may be used to attract minority carriers (associated with the above mentioned diffusion current) away from the the source and drain regions. This may reduce the leakage current at the junctions between the source region 2 and drain region 6 and the first semiconductor region 40. In this way, the leakage current within the device 10 may be reduced in a manner that need not necessarily degrade the figure-of-merit $(R_{on} \times C_{off})$ for the device 10 and/or that need not significantly increase the complexity of the device 10.

In the example of FIG. 1, the location of the sinker regions 8 within the first semiconductor region 40 may enhance their ability to attract minority carriers away from the source region 2 and the drain region 6, due to the proximity of the sinker regions 8 to the source region 2 and the drain region 6. Moreover, it is envisaged that the provision of a respective source sinker region and drain sinker region for the source region 2 and drain region 6, may further enhance the ability of the sinker regions 8 to attract minority carriers away from the source region 2 and drain region 6.

The external potential to which the sinker region(s) 8 may be connected may, for instance, be a ground potential. In the case of a device including an NMOS transistor as shown for example in FIG. 1, the external potential may also be a positive potential, for attracting the minority carriers (electrons). In examples including instead a PMOS transistor, the external potential may be a negative potential, for attracting the minority carriers (holes). In some embodiments, the sinker region(s) 8 may be connected to a supply voltage (positive in the case of NMOS, negative in the case of PMOS) of the device 10.

In the example of FIG. 1, the sinker region(s) 8 are located in the first semiconductor region 40 along with the source region 2 and drain region 6. However, it is also envisaged that the sinker region(s) may be located outside the first semiconductor region 40. An example of this is shown in FIG. 2.

The device 10 shown in the embodiment of FIG. 2 is similar in some respects to the device 10 shown in FIG. 1, and only the differences will be described in detail below.

The device in FIG. 2 includes a first semiconductor region 40, which may comprise silicon be doped to have p-type conductivity. The first semiconductor region 40 in this example (and also the semiconductor regions 60 described below) is formed from a region of silicon located near the major surface of a semiconductor substrate. Each semiconductor region 60 may be doped to have the second conductivity type, which in the present example, is n-type. Note that the semiconductor regions 60 have the opposite conductivity type to the first semiconductor region 40. In this example, the first semiconductor region 40 is located on top of a buried semiconductor layer 38. The layer 38 is p-type doped, and has a doping level which is higher than that of the first semiconductor region 40. As described already in respect of FIG. 1, the layer 38 may be provided to reduce leakage currents within the NMOS device.

In the present example, the buried semiconductor layer 38 is located on top of an underlying part 36 of the semiconductor substrate. The layer that forms the buried semiconductor layer 38 in this example may also extend across the substrate. The semiconductor regions 60 may be located on top of a buried semiconductor layer 58, which may be doped to have the second conductivity type (n-type in the present example). It is envisaged that the layer 58 may be omitted.

As described already above in relation to FIG. 1, it is envisaged that in some embodiments the dopant level within the layer 38 may be lowered, or the layer 38 may be omitted (in which case the first semiconductor region 40 may be located directly on the underlying part 36 of the semiconductor substrate).

The first semiconductor region 40, may be separated from the semiconductor regions 60 by isolation regions 52 similar to the isolation regions 52 described above in relation to FIG. 1. Note that, similar to the arrangement of FIG. 1, the semiconductor regions 60 are electrically connected to the underlying part 36 of the semiconductor substrate. The example of FIG. 2 also includes further isolation regions 30 (such as shallow trench isolation (STI)), which in this example separate the features of the NMOS transistor formed in the first semiconductor region 40 from the sinker region(s) 8 to be described below. Again, one or more inter metal dielectric layers 24, 26, 28 of the kind described above may be provided on the major surface of the semiconductor substrate.

The device 10 in this example includes a source region 2 and a drain region 6, which are both located in the first semiconductor region 40. The source region 2 and the drain region 6 in this example are doped to have n-type conductivity. The source region 2 and the drain region 6 are separated by a gate 4. The gate 4 may include a gate electrode located on a gate dielectric, which itself may be located on a part of the major surface of the semiconductor substrate located in between the source region 2 and the drain region 6. It will be appreciated that the transistor formed by the source region 2, drain region 6 and gate 4 in this example is an NMOS transistor, although as mentioned previously, it is envisaged that embodiments of this disclosure may alternatively include a PMOS transistor.

Contacts 12, 16 may provide electrical connections to the source region 2 and the drain region 6, respectively. A similar contact may be used to provide an electrical connection for the gate 4 (not shown in FIG. 2). Each contact may include a part 42, which extends down through the inter metal dielectric layers 24, 26, 28 to connect with the source region 2, drain region 6 and gate 4.

In order to apply a potential to the first semiconductor region 40 (within which the channel region of the NMOS transistor will be formed during operation of the device 10), one or more further semiconductor regions 22 may be provided in this example. The further semiconductor region 22 in this example is doped to have p-type conductivity, and may typically have a doping level that is higher than the doping level of the semiconductor region 40. The further semiconductor region 22 may be provided with a contact 32 similar to the contacts 12, 16 described above in respect of the source region 2 and the drain region 6. In common with the example of FIG. 1, a potential applied to the contact 32 may be used to vary the potential within the first semiconductor region 40. However, in contrast to the example of FIG. 1, in the present example, the further semiconductor region 22 is located in the first semiconductor region 40. In the present example, the proximity of the further semiconductor region 22 may enhance the ability of a potential applied to the contact 32 to control the potential within the first semiconductor region 40 in the vicinity of the gate 4.

Each further semiconductor region 22 located in the first semiconductor region 40 may be separated from the source region or the drain region by a spacer. In the present example, the further semiconductor region 22 is separated from the source region 2 by a dummy gate 20 of the kind already described in relation to FIG. 1. As with the spacers described in FIG. 1, it is envisaged that other kinds of spacer may be used in FIG. 2, such as an isolation region (e.g. a trench containing dielectric) located in the first semiconductor region 40.

The device 10 in this embodiment is provided with at least one sinker region 8. Each sinker region 8 is doped to have n-type conductivity in this example. In devices forming PMOS transistors, the sinker regions may instead be doped to have p-type conductivity. The doping level of the sinker regions 8 (and also of the source region 2 and drain region 6) may be higher than that of the first semiconductor region 40 (noting also that the sinker regions 8, the source region 2 and the drain region 6 each have a conductivity type that is different to that of the first semiconductor region 40). It is envisaged that the sinker regions 8 may be formed using the same process step (e.g. by ion implantation) that is used to form the source region 2 and the drain region 6.

Each sinker region may be connectable to an external potential. For instance, as shown in FIG. 1, each sinker region 8 may be provided with a contact 18, which may be similar to the contacts 18 described above in relation to FIG. 1.

The present example includes two sinker regions 8. It is envisaged that a single sinker region 8 (or more than two sinker regions 8) may be provided. In the present example, each sinker region 8 is located outside the first semiconductor region 40. As shown in FIG. 2, each sinker region 8 may be located in one of the semiconductor regions 60. As noted previously, the semiconductor regions 60 are electrically connected to the underlying part 36 of the semiconductor substrate in this example. Accordingly, a potential applied to the contacts 18 may be used to attract minority carriers away from the source region 2 and the drain region 4 located in the first semiconductor region 40 as described already in relation to FIG. 1. Again, this may allow a leakage current at the junctions between the source region 2 and drain region 6 and the first semiconductor region 40 to be reduced.

As also described in relation to FIG. 1, the external potential to which the sinker region(s) 8 may be connected may, for instance, be a ground potential. In the case of a device including an NMOS transistor as shown for example in FIG. 2, the external potential may also be a positive potential, for attracting the minority carriers (electrons). In examples including instead a PMOS transistor, the external potential may be a negative potential, for attracting the minority carriers (holes). In some embodiments, the sinker region(s) 8 may be connected to a supply voltage (positive in the case of NMOS, negative in the case of PMOS) of the device 10.

In the example of FIG. 1, the sinker region(s) 8 are located in the first semiconductor region 40 along with the source region 2 and drain region 6, while in the example of FIG. 2, the sinker region(s) 8 are located outside the first semiconductor region 40. It is envisaged that a hybrid approach may be used in some embodiments, in which one or more sinker regions 8 are located in the first semiconductor region 40 (e.g. as shown in FIG. 1) and in which one or more sinker regions 8 are located outside the first semiconductor region 40 (e.g. as shown in FIG. 2). Similarly, it is envisaged that in some examples further semiconductor regions such as the further semiconductor regions 22 shown in FIGS. 1 and 2 may be provided both in the first semiconductor region 40 (e.g. as shown in FIG. 1) and outside the first semiconductor region 40 (e.g. as shown in FIG. 2).

A method of making a semiconductor RF switch device of the kind described herein may include providing a first semiconductor region having a first conductivity type. The first region may, for instance, be formed by doping (e.g. by ion implantation) part of a semiconductor layer located at the major surface of a semiconductor substrate. The substrate may for instance be a bulk silicon wafer, although it is also envisaged that an SOI wafer may be used, as noted previously.

In embodiments of the kind shown in FIGS. 1 and 2, the dopants used to form the first semiconductor region may be chosen such that the first conductivity type is p-type, typically, but not limited to, Boron or Indium (so that the source and drain and gate form an NMOS transistor in the first semiconductor region). In other examples, the dopants used to form the first semiconductor region may be chosen such that the first conductivity type is n-type, typically, but not limited to, Arsenic or Phosphorous (so that the source and drain and gate form an PMOS transistor in the first semiconductor region).

The method also includes forming a gate. The gate may comprise a gate electrode located on a gate dielectric, which is located the major surface of the substrate. The dielectric and gate electrode may be patterned to the chosen dimensions using standard lithographic techniques. The method further includes forming a source region and a drain region located in the first semiconductor region. The source region and drain region may be formed by using ion implantation. In the finished device, the gate is located between the source region and the drain region. It is envisaged that the gate may be formed either before or after the source and drain regions have been formed. The source region and the drain region have a second conductivity type, that is different to the first conductivity type (the dopants used to form these regions may be chosen accordingly (e.g. Arsenic and/or Phosphorus for n-type doping and e.g. Boron for p-type doping)). Thus, the source and drain regions each have a different conductivity type to the first semiconductor region.

The method also includes forming at least one sinker region having the second conductivity type. Again, these sinker regions may be formed using e.g. ion implantation, and the dopants may be chosen according to whether the first conductivity type is n-type or p-type (e.g. Arsenic and/or Phosphorus or Antimony for n-type doping and e.g. Boron or Indium for p-type doping). The sinker regions may be formed either inside the first semiconductor region (e.g. as per FIG. 1) or outside the first semiconductor region (e.g. as per FIG. 2). As already described, in the finished device, each sinker region may be connected to an external potential for drawing minority carriers away from the source and drain regions to reduce a leakage current at junctions between the source and drain regions and the first semiconductor region.

In some examples, further semiconductor regions of the kind described in relation to FIGS. 1 and 2 may be formed (again using e.g. ion implantation) for applying a potential to the first semiconductor region.

Following the formation of the above described features, one or more protective layers (such as the inter metal dielectric layers 24, 26, 28 described in relation to FIGS. 1 and 2) may be deposited on the major surface of the semiconductor substrate.

The features of the device, such as the source region, drain region, gate, sinker region(s) and further semiconductor region(s) may be provided with contacts such as those described above in relation to FIGS. 1 and 2. The contacts may, for instance, be metallic. The contacts may be formed using standard deposition and patterning steps.

As already described in relation to FIGS. 1 and 2, there are a number of options for the placement of the sinker region(s) and also the further semiconductor regions. Where one or more sinker regions and/or further semiconductor regions of the kind noted above are located outside the first semiconductor region, then the method include forming isolation regions such as the trenches described above. Standard manufacturing techniques may be used to form these isolation regions.

Accordingly, there has been described a semiconductor switch device for switching an RF signal and a method of making the same. The device includes a first semiconductor region having a first conductivity type. The device also includes a source region and a drain region located in the first semiconductor region. The source region and the drain region have a second conductivity type. The second conductivity type is different to the first conductivity type. The device further includes a gate separating the source region from the drain region. The device also includes at least one sinker region having the second conductivity type. Each sinker region is connectable to an external potential for drawing minority carriers away from the source and drain regions to reduce a leakage current at junctions between the source and drain regions and the first semiconductor region.

Although particular embodiments of this disclosure have been described, it will be appreciated that many modifications/additions and/or substitutions may be made within the scope of the claims.

The invention claimed is:

1. A semiconductor switch device for switching an RF signal, the semiconductor switch device comprising:
   a first semiconductor region having a first conductivity type;

a semiconductor layer having the first conductivity type located immediately beneath the first semiconductor region, wherein a doping level of the semiconductor layer is higher than a doping level of the first semiconductor region;

a source region and a drain region located in the first semiconductor region, wherein the source region and the drain region have a second conductivity type and the second conductivity type is opposite from the first conductivity type;

a gate separating the source region from the drain region; and a sinker region having the second conductivity type, wherein the sinker region is connectable to an external potential and located outside the first semiconductor region, the sinker region is located between two isolation regions, and each isolation region is a trench containing dielectric.

2. The semiconductor switch device of claim 1, wherein the sinker region is electrically connected to an underlying substrate region of the semiconductor switch device.

3. The semiconductor switch device of claim 1, further comprising:

a further semiconductor region having said first conductivity type, wherein the further semiconductor region is connectable to a second external potential for applying the second external potential to the first semiconductor region.

4. The semiconductor switch device of claim 3, wherein the further semiconductor region is located in the first semiconductor region with the source region and the drain region.

5. The semiconductor switch device of claim 1, wherein the external potential is ground or is a power supply potential of the semiconductor switch device.

6. The semiconductor switch device of claim 1, wherein the first conductivity type is p-type and the second conductivity type is n-type.

7. A method of making a semiconductor switch device for switching an RF signal, the method comprising:

providing a first semiconductor region having a first conductivity type;

forming a gate;

forming a source region and a drain region located in the first semiconductor region, wherein the source region and the drain region have a second conductivity type, the second conductivity type is opposite from the first conductivity type, and the gate separates the source region from the drain region; and forming a sinker region having the second conductivity type, wherein the sinker region is connectable to an external potential for drawing minority carriers away from the source region and the drain region to reduce a leakage current at junctions between the source region and the drain region and the first semiconductor region, the sinker region is located outside the first semiconductor region, the sinker region is located between two isolation regions, and each isolation region is a trench containing dielectric.

8. A semiconductor switch device for switching an RF signal, the semiconductor switch device comprising:

a first semiconductor region having a first conductivity type;

a source region and a drain region located in the first semiconductor region, wherein the source region and the drain region have a second conductivity type and the second conductivity type is opposite from the first conductivity type;

a gate separating the source region from the drain region; and a sinker region having the second conductivity type, wherein the sinker region is connectable to an external potential for drawing minority carriers away from the source region and the drain region to reduce a leakage current at junctions between the source region and the drain region and the first semiconductor region and located outside the first semiconductor region, the sinker region is located between two isolation regions, and each isolation region is a trench containing dielectric.

9. The semiconductor switch device of claim 1, wherein the sinker region is connectable to the external potential by a contact.

10. The semiconductor switch device of claim 1, wherein a doping level of the sinker region is higher than the doping level of the first semiconductor region.

11. The semiconductor switch device of claim 3, wherein a doping level of the further semiconductor region is higher than the doping level of the first semiconductor region.

12. The semiconductor switch device of claim 3, wherein the further semiconductor region is coupled to a contact.

13. The semiconductor switch device of claim 12, wherein application of a potential to the contact is configured to vary a potential with the first semiconductor region.

* * * * *